(12) United States Patent
Takazane

(10) Patent No.: US 10,003,170 B2
(45) Date of Patent: Jun. 19, 2018

(54) SOLDERING SYSTEM OF SEMICONDUCTOR LASER ELEMENT

(71) Applicant: FANUC CORPORATION, Yamanashi (JP)

(72) Inventor: Tetsuhisa Takazane, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days. days.

(21) Appl. No.: 15/615,060

(22) Filed: Jun. 6, 2017

(65) Prior Publication Data
US 2017/0373466 A1    Dec. 28, 2017

(30) Foreign Application Priority Data

Jun. 24, 2016 (JP) .................... 2016-125444

(51) Int. Cl.
| | |
|---|---|
| *H01L 21/00* | (2006.01) |
| *H01S 5/022* | (2006.01) |
| *H01S 5/02* | (2006.01) |
| *H01S 5/062* | (2006.01) |
| *H01S 5/068* | (2006.01) |

(52) U.S. Cl.
CPC ........ *H01S 5/02272* (2013.01); *H01S 5/0216* (2013.01); *H01S 5/068* (2013.01); *H01S 5/06233* (2013.01); *H01S 5/06243* (2013.01)

(58) Field of Classification Search
CPC ............... H01S 5/02272; H01S 5/0216; H01S 5/06233; H01S 5/06243; H01S 5/068; B23K 1/0056; B23K 26/0626; B23K 26/073; H05K 3/3494

USPC ........................................... 438/28
See application file for complete search history.

(56) References Cited

U.S. PATENT DOCUMENTS

| | | | |
|---|---|---|---|
| 6,278,078 B1* | 8/2001 | Walvoord | B23K 1/0056 219/121.61 |
| 7,407,878 B2* | 8/2008 | Li | H01L 24/11 257/738 |

FOREIGN PATENT DOCUMENTS

| | | |
|---|---|---|
| JP | 5-63353 | 3/1993 |
| JP | 2006-324599 | 11/2006 |
| JP | 2013-74231 | 4/2013 |
| JP | 2014-102206 | 6/2014 |

\* cited by examiner

*Primary Examiner* — Brook Kebede
(74) *Attorney, Agent, or Firm* — Wenderoth, Lind & Ponack, L.L.P.

(57) ABSTRACT

A soldering system that determines soldering quality of elements relative to a housing at the moment of soldering semiconductor laser elements. A soldering device that performs soldering of a semiconductor laser element to a semiconductor laser module, a robot that conveys the module, a camera, and a control device that controls the robot and camera based on imaging output of the camera. The robot conveys the module and changes the position and posture of the camera. The camera images the module. The control device calculates the position of the semiconductor laser element based on the imaging output, calculates parallelism between the housing of the module and the semiconductor laser element based on the change in light intensity related to the imaging output when changing the relative position between the camera and the subject, and determines the quality of soldering of the semiconductor laser element based on the position and parallelism.

7 Claims, 3 Drawing Sheets

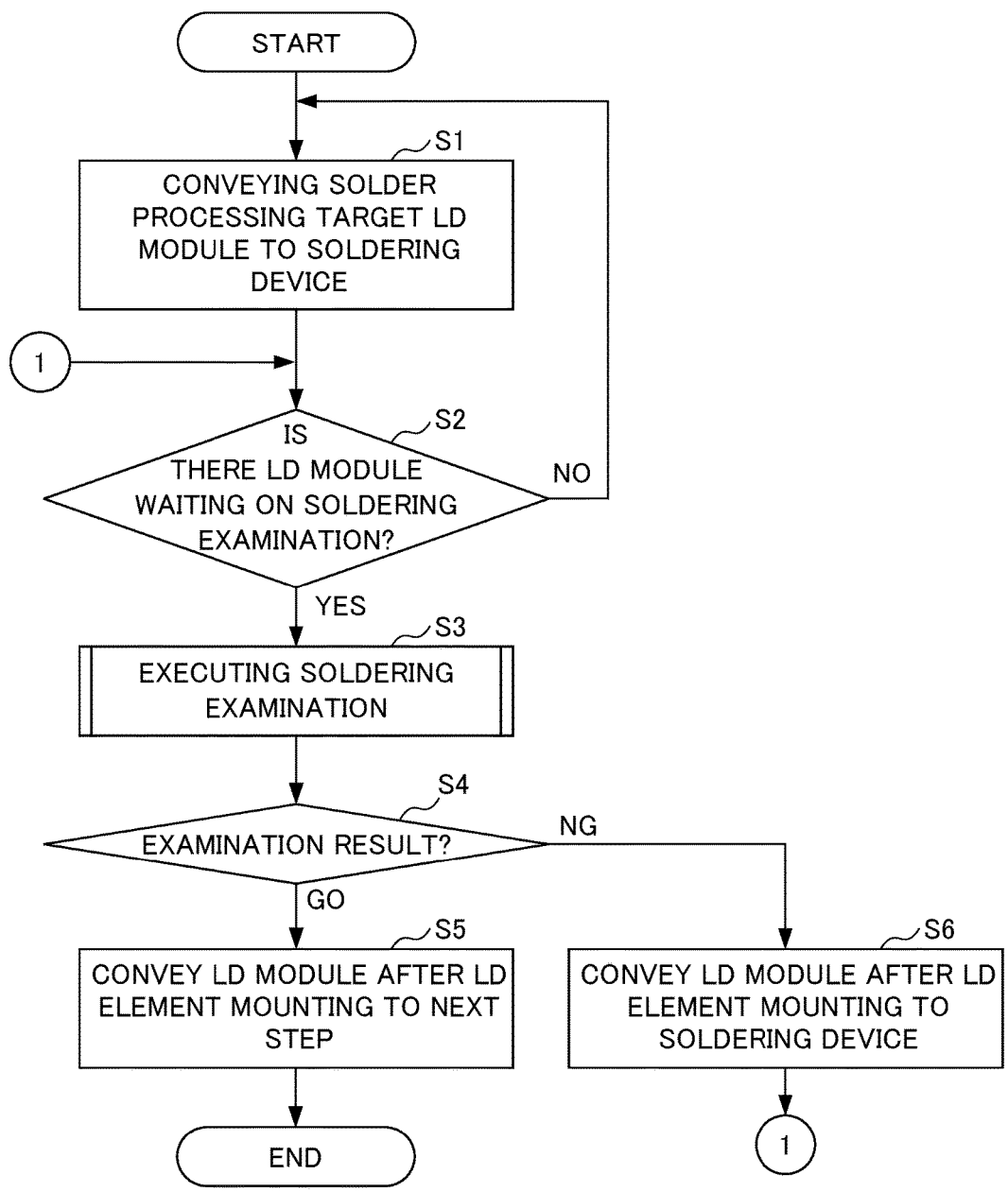

SOLDERING SYSTEM OF SEMICONDUCTOR LASER ELEMENT

This application is based on and claims the benefit of priority from Japanese Patent Application No. 2016-125444, filed on 24 Jun. 2016, the content of which is incorporated herein by reference.

BACKGROUND OF THE INVENTION

Field of the Invention

The present invention relates to a soldering system of a semiconductor laser element suitable to the manufacture of semiconductor laser modules, for example.

Related Art

Laser oscillators applied to laser processing machines used in cutting, welding, etc. of metal, resin materials, etc., are equipped with a semiconductor laser module as a light source or light source for excitation. The semiconductor laser module couples (optical coupling) the laser beam excited by the semiconductor laser element to optical fiber, and provides a laser to the laser oscillator through the optical fiber. The semiconductor laser module is configured to have a housing and one or a plurality of semiconductor laser elements. In such a semiconductor laser module, soldering is used in order to directly or indirectly (via another member) fix the semiconductor laser element(s) to the housing. It should be noted that, unless necessary to distinguish in particular, both the case of directly and the case of indirectly will be included in fixing of the semiconductor laser element to the housing.

The laser beam irradiated from the semiconductor laser element of the semiconductor laser module must be coupled to the optical fiber. In this case, the positional precision of the semiconductor laser element influences the coupling efficiency to the optical fiber. High positional precision, and parallelism between the semiconductor laser element(s) and housing (hereinafter referred to simply as "parallelism" as appropriate) are demanded in soldering of semiconductor laser elements. In the case of fixing semiconductor laser elements by soldering, a solder layer invariably exists between the semiconductor laser module and the semiconductor laser element. When performing soldering, the solder temporarily enters a molten state, the solder solidifies by cooling, and the semiconductor laser element is fixed to the housing. For the semiconductor laser element, soldering is performed in a state fixed by a robot hand; however, in the course of the solder layer temporarily melting and then cooling to solidify, it is possible for the positional precision and parallelism to deteriorate.

Although the light of the semiconductor laser element is coupled to the optical fiber by adjustment of the optical system of the semiconductor laser module, in the case of the positional precision of the semiconductor laser element deteriorating, the coupling state cannot be adjusted by adjustment of the optical system, and the coupling efficiency to the optical fiber deteriorates. Generally, the coupling efficiency to optical fiber cannot be determined until completing the semiconductor laser module, and measuring the output of the laser beam irradiated from the optical fiber. In addition, a semiconductor laser module having poor coupling efficiency as a result of the determination will be scrapped. Although it is possible to improve the coupling efficiency by re-adjustment of the position of the semiconductor laser element and optical system, the matter of dismantling a semiconductor laser module once completed and re-adjusting is not practical when considering the workload and cost of components that cannot be reused.

A method of determining general soldering quality by image recognition, and automatically correcting upon having a defect has been proposed thus far (for example, refer to Patent Document 1). In such a case, a method of determining positional precision using geometrical characteristic points from camera images has also been proposed thus far (for example, refer to Patent Document 2). In addition, technology which includes a plurality of cameras in a die bonder, and tries to achieve higher precision in image recognition by stereo vision has also been proposed (for example, refer to Patent Document 3). Furthermore, there has also been a proposal which configures a soldering device to include a robot and camera, and tries to improve the efficiency of soldering quality determination (for example, refer to Patent Document 4).

Patent Document 1: Japanese Unexamined Patent Application, Publication No. H05-063353
Patent Document 2: Japanese Unexamined Patent Application, Publication No. 2014-102206
Patent Document 3: Japanese Unexamined Patent Application, Publication No. 2006-324599
Patent Document 4: Japanese Unexamined Patent Application, Publication No. 2013-074231

SUMMARY OF THE INVENTION

A case of applying the image recognition described in Patent Document 1 to quality determination upon soldering semiconductor laser elements to a semiconductor laser module housing is assumed. In this case, since the detection method of parallelism between the semiconductor laser module housing and the semiconductor laser elements is in no way disclosed, it would not be possible to determine the quality of soldering of semiconductor laser elements for the above-mentioned point of parallelism based on the technology of Patent Document 1.

The technology described in Patent Document 2 performs positional correction of the substrate in a short time, by capturing geometrical characteristic points. However, Patent Document 2 in no way discloses quality determination in the case of soldering semiconductor laser elements to a semiconductor laser module housing.

With the technology described in Patent Document 3, although it achieves higher precision in image recognition by stereo vision, this technology has no special viewpoint for the detection of parallelism between the semiconductor laser module housing and the semiconductor laser elements.

With the technology described in Patent Document 4, although a size reduction is achieved by integrating the soldering device and the detection device, this technology has no special viewpoint for the detection of parallelism between the semiconductor laser module housing and the semiconductor laser elements.

With the above technologies of Patent Documents 1 to 4, since detection of parallelism between the semiconductor laser module housing and the semiconductor laser elements cannot be performed, it is not possible to perform the soldering quality determination of semiconductor laser elements on the semiconductor laser module including the aforementioned point of the detection of parallelism. Therefore, the soldering quality cannot be determined until completing the semiconductor laser module and coupling the light of the semiconductor laser element to the fiber. The matter of performing soldering of semiconductor elements after completing in this way is inefficient due to the workload of removing components and there being components which cannot be reused.

The present invention has been made taking account of the above such situation, and has an object of providing a soldering system of semiconductor laser elements which can determine the quality of soldering of semiconductor laser elements to a semiconductor laser module housing at the moment of soldering the semiconductor laser elements.

A soldering system of semiconductor laser elements (e.g., the soldering system 1 of semiconductor elements described later) according to the present invention includes: a soldering device (e.g., the soldering device 20 described later) that performs soldering of a semiconductor laser element (e.g., the semiconductor laser element 12 described later) in a semiconductor laser module (e.g., the semiconductor laser module 10 described later) having a housing and at least one of the semiconductor laser element; a robot (e.g., the robot 30 described later) that conveys the semiconductor laser module; a camera (e.g., the camera 40 described later) that can put the semiconductor laser module in a field of view thereof; and a control device (e.g., the control device 50 described later) that controls the robot and the camera with imaging output of the camera as one control factor, in which the robot conveys the semiconductor laser module to an installation position of the soldering device and an imaging field of view position of the camera, and is capable of changing relative positions between the camera and a subject, under control of the control device, in which the camera images the semiconductor laser module which is in the imaging field of view position thereof under control of the control device, and in which the control device executes a quality determination mode that calculates a position of the semiconductor laser element based on the imaging output of the camera, as well as calculating parallelism between the housing of the semiconductor laser module and the semiconductor laser element based on a change in light intensity related to the imaging output when changing a relative position between the camera and the subject, and determines soldering quality of the semiconductor laser element based on the position and parallelism thus calculated.

According to an aspect of the soldering system of semiconductor laser elements of the present invention, the control device controls the robot so as to convey the semiconductor laser module to the soldering device, when determining that soldering of the semiconductor laser element is inferior according to the quality determination mode; and the soldering device (20) solders again the semiconductor laser element thus conveyed.

According to an aspect of the soldering system of semiconductor laser elements of the present invention, the control device compares inclination of a member between the semiconductor laser element and the housing relative to the housing, and inclination of the semiconductor laser element relative to the housing, in the quality determination mode.

According to an aspect of the soldering system of semiconductor laser elements of the present invention, the soldering system further includes illumination (e.g., the illumination 80 described later) having a plurality of light-emitting parts (e.g., the light-emitting parts 81, 82, 83, 84 described later) capable of individually emitting light arranged at a circumference of the camera, in which the control device calculates inclination of the member relative to the housing, and inclination of the semiconductor laser element relative to the housing, in a case of each of the plurality of light-emitting parts of the illumination emitting light, based on a change in light intensity corresponding to the respective emitted light acquired from the camera.

According to an aspect of the soldering system of semiconductor laser elements of the present invention, the camera is supported by the robot; and the control device controls the robot to cause the camera to change position so as to change a relative angle between an imaging optical axis of the camera and the semiconductor laser module.

According to an aspect of the soldering system of semiconductor laser elements of the present invention, the camera is supported by a fixing member (e.g., the fixing member 70 described later) independent from movement of the robot; and the control device controls the robot to cause the semiconductor laser module to change position so as to change a relative angle between an imaging optical axis of the camera and the semiconductor laser module.

According to an aspect of the soldering system of semiconductor laser elements of the present invention, the robot is configured to include the control device.

According to the present invention, it is possible to realize a soldering system of semiconductor laser elements which can determine the quality of soldering of semiconductor laser elements to a semiconductor laser module housing at the moment of soldering the semiconductor laser elements.

BRIEF DESCRIPTION OF THE DRAWINGS

FIG. 7 is a flowchart of operations of a control device and robot applied to an embodiment of the present invention.

DETAILED DESCRIPTION OF THE INVENTION

Figure 1:
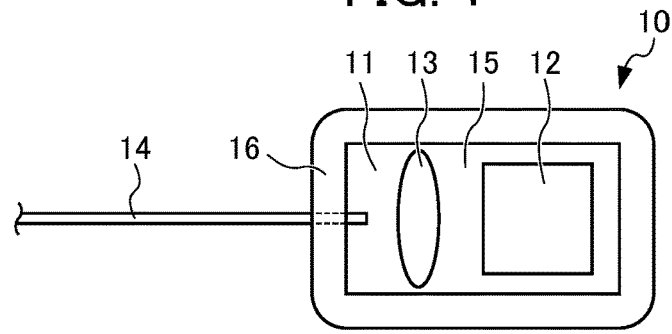
FIG. 1 is a view representing the interior of a semiconductor laser module.

FIG. 1 is a view representing the interior of a semiconductor laser module on which soldering is performed by a soldering system of semiconductor laser elements as an embodiment of the present invention. A semiconductor laser module 10 is configured from a housing 11, semiconductor laser element 12, lens 13, and optical fiber 14. The semiconductor laser element 12 is soldered to a base 15 of the housing 11, aligned with the optical axis of the lens 13 which concentrates the emitted light of this semiconductor laser element 12, and the optical fiber 14 is fixed to a fixing part 16 of the housing 11.

The laser beam irradiated from the semiconductor laser element 12 is condensed on the lens 13, and coupled to the optical fiber 14. Although positional adjustment of the lens 13 is performed so as to couple the most of the laser beam to the optical fiber 14 as possible, the coupling efficiency deteriorates if the position or inclination of the semiconductor laser element 12 relative to the housing 11 is poor. For this reason, the position and inclination of the semiconductor laser element 12 is detected by camera as described later to determine the quality.

It should be noted that the semiconductor laser module 10 in FIG. 1 is of a specification having one semiconductor laser element 12; however, the semiconductor laser module on which soldering and detection are performed by the soldering system of semiconductor laser elements of the present invention is not limited thereto, and modules of a specification having a plurality of the semiconductor laser elements 12 are also a target.

FIG. 12 is an outline block diagram showing a soldering system of semiconductor laser elements as an embodiment of the present invention. This soldering system 1 of semiconductor laser elements is configured to include: a soldering device 20 that performs soldering of the semiconductor laser element 12 on the semiconductor laser module 10; a robot 30 that conveys the semiconductor laser module 10; a camera 40 that can capture the semiconductor laser module 10 in the imaging field of view; and a control device 50 that controls the robot 30 and camera 40 with the image output of the camera 40 as one control factor. In the soldering system 1 of semiconductor laser elements of the present embodiment, the soldering device 20 also operates under the control of the control device 50.

Figure 2:
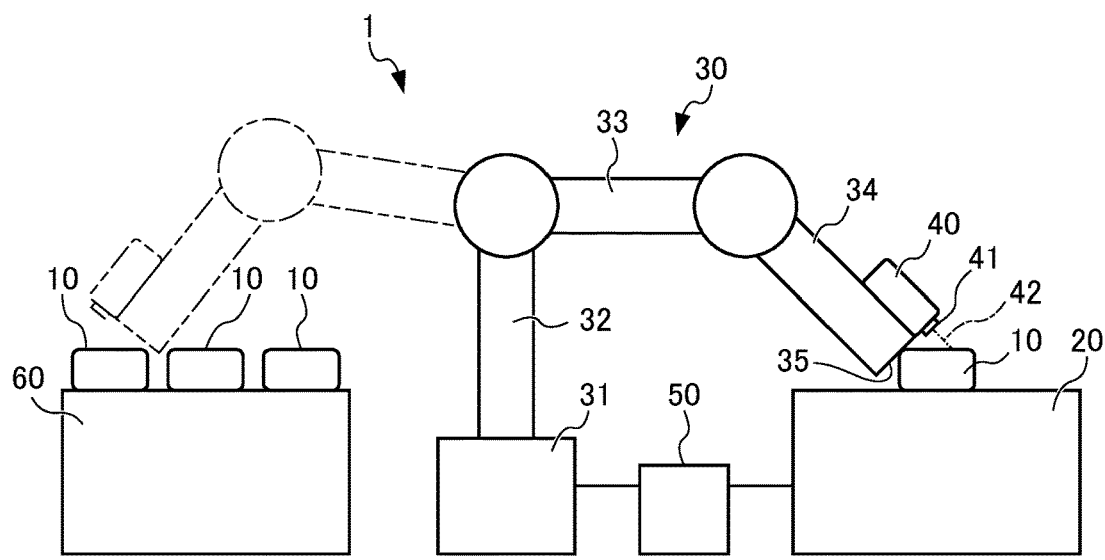
FIG. 2 is an outline block diagram showing a soldering system of semiconductor laser elements as an embodiment of the present invention.

It should be noted that a component placement stand 60 for placing the semiconductor laser module 10 conveyed by the rotor 30 onto is provided to the soldering system 1 of semiconductor laser elements in FIG. 2.

In the robot 30, a first arm 32 and second arm 33 extend out from a robot base 31 in the order of the drawing, and a hand mechanism 34 is provided to a leading end side of the second arm 33. In the present embodiment, the aforementioned camera 40 is mounted in the vicinity of a hand 35 on the leading end side of the hand mechanism 34, and an imaging optical axis 42 is oriented forward of the hand 35 by an imaging lens 41 thereof.

By the first arm 32 articulating on the robot base 31, and the second arm 33 and hand mechanism 34 moving from the position of the two-dot dashed line in the drawing to the position of the solid lines in the drawing under the control of the control device 50, the robot 30 conveys the semiconductor laser module 10 placed on the component placement stand 60 to the soldering device 20. The soldering device 20 performs soldering of the semiconductor laser element 12 to the housing 11 of the semiconductor laser module 10. The semiconductor laser module 10 on which the semiconductor laser element 12 has been soldered is conveyed to the component placement stand 60 by the robot 30. The robot 30 conveys the next semiconductor laser module 10 to the soldering device 20. While soldering is being performed at the soldering device 20, the camera 40 mounted to the robot 30 photographs the semiconductor laser module 10 on the component placement stand 60 to which the semiconductor laser element 12 was soldered, under the control of the control device 50.

The aforementioned such conveying of the semiconductor laser module 10 and posture control of the camera 40 are performed by the robot 30. In other words, the robot 30 conveys the semiconductor laser module 10 under the control of the control device 50 to an installation position on the soldering device 20 and an imaging field of view position of the camera 40 (i.e. positions so that the semiconductor laser module 10 is included in the imaging field of view of the camera 40), and operates so as to change the relative positions of the camera 40 and subject (i.e. when the semiconductor laser module 10 had settled in the imaging field of view, this semiconductor laser module 10). The camera 40 photographs the aforementioned semiconductor laser module 10 which is in its imaging field of view point under the control of the control device 50.

The control device 50 calculates the position of the semiconductor laser element 12 based on the imaging output of the camera 40. Together with this, based on the change in light intensity (light intensity related to the semiconductor laser element 12 which is the subject) related to this imaging output when causing the relative position between the camera 40 and subject (in the specified case, the semiconductor laser module 10) to change, the parallelism between the housing 11 of the semiconductor laser module 10 and the semiconductor laser element 12 is calculated. In the above, the relative position may be merely spatial position, posture of camera 40. The control device 50 executes quality determination mode operation to determine the soldering quality of the semiconductor laser element 12 depending on the position and parallelism calculated as mentioned above. It should be noted that, upon calculating the aforementioned position and parallelism of the semiconductor laser element 12, various techniques employing image recognition on images from the imaging output are applied.

For the change in light intensity related to the semiconductor laser element 12 during photography by the camera 40, for example, if made in a configuration in which the subject light enters coaxially with the imaging lens 41 of the camera 40, since the subject light will reflect from the surface of the semiconductor laser element 12 and enter the camera 40 when made face-to-face with the camera, the light intensity will become the greatest, and the light intensity will decrease as tilting the camera 40. When in a posture at which the light intensity is the greatest, it is found that the camera 40 and semiconductor laser element 12 are face-to-face.

The control device 50 executes quality determination mode operation, and in the case of the determination result being good, controls the robot 30 so as to convey the semiconductor laser module 10 to a completed product placement location. On the other hand, the control device 50 executes quality determination mode operation, and in the case of the determination result being poor, controls the robot 30 so as to convey the semiconductor laser module 10 to the soldering device 20. Next, the control device 50 sends a signal to perform soldering again to the soldering device 20. It may repair by re-soldering the semiconductor laser element 12 determined as inferior, or may solder a new semiconductor laser element 12 different from the semiconductor laser element 12 determined as inferior. The soldering device 20 performs re-soldering under the control of the control device 50. When the soldering of the soldering device 20 ends, the robot 30 retrieves the semiconductor laser module 10 under the control of the control device 50. The control device 50 executes quality determination mode operation again similarly to as mentioned above with the semiconductor laser module 10 retrieved as mentioned above as the target. The subsequent operations are the same.

When soldering the semiconductor laser element 12 to the semiconductor laser module 10, the semiconductor laser module 10 is heated and reaches high temperature. In a high-temperature state, the measured values for the positional precision and parallelism are not stable. In order to cope with such a situation, it may include a cooling mechanism of the semiconductor laser module 10 in the soldering system 1 of semiconductor laser elements. In addition, a configuration that measures position and parallelism may be adopted by configuring so as to convey the semiconductor laser module retrieved to the robot 30 from the soldering device 20 to a measurement stand including a cooling function. By making such a configuration, it is possible to achieve stabilization and a speed-increase in measurement.

Figure 3:
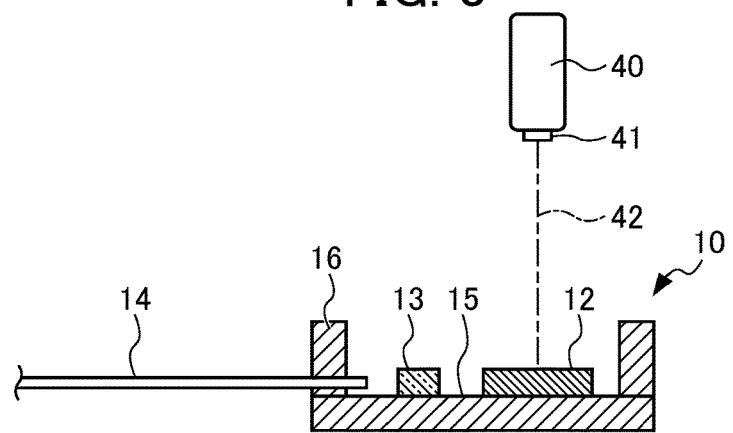
FIG. 3 is a cross-sectional view showing an example of a semiconductor laser module performing quality determination using a camera.

FIG. 3 is a cross-sectional view showing an example of a semiconductor laser module that performs quality determination using a camera. The camera 40 detects the inclination of the semiconductor laser element 12 on the semiconductor laser module 10, and the inclination of the housing 11 (base 15 thereof) on which the semiconductor laser element 12 is installed. By comparing the difference between these two inclinations with a default value, the quality of the inclination of the semiconductor laser element 12 is determined. For the inclination of semiconductor laser element 12 or lens 13, higher precision determination of the inclination of the semiconductor laser element 12 comes to be possible by comparing with the inclination of the base 15 of the housing 11 of the semiconductor laser module 10, due to the base 15 of the housing 11 of the semiconductor laser module 10 being a reference.

Figure 4:
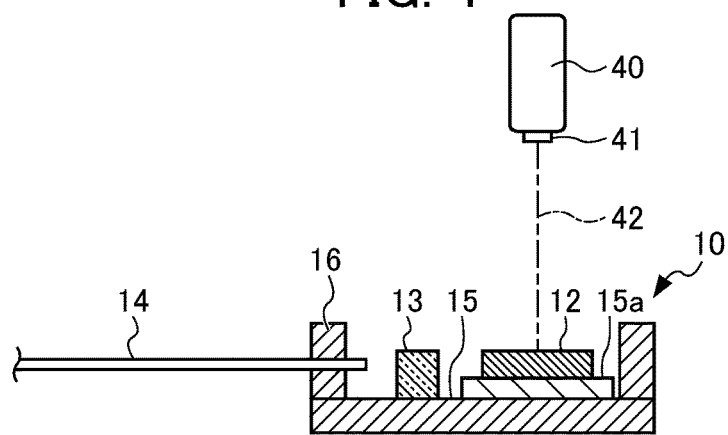
FIG. 4 is a cross-sectional view showing another example of a semiconductor laser module performing quality determination using a camera.

FIG. 4 is a cross-sectional view showing another example of a semiconductor laser module that performs quality determination using a camera. There are also cases of a semiconductor laser module of a configuration in which one other or a plurality of members 15*a* are arranged between the semiconductor laser element 12 and the housing 11 (base 15 thereof) of the semiconductor laser module 10. In this case, the soldering device 20 solders the semiconductor laser module 10 and the member 15*a* thereabove, and determines the positional precision and parallelism of the member 15*a*. In the case of the determination result thereof being good, the procedure of performing soldering of members thereabove is repeated. By configuring in this way, it is possible to solder until the top-most semiconductor laser element 12. After soldering the semiconductor laser element 12, in the case of confirming the parallelism of a member 15*a* between the semiconductor laser element 12 and housing 11, it is necessary for the member 15*a* to be a shape larger than the semiconductor laser element 12. After all soldering has completed, it is also possible to confirm the positional precision and parallelism of all members (member 15*a* noted representatively herein).

Figure 5:
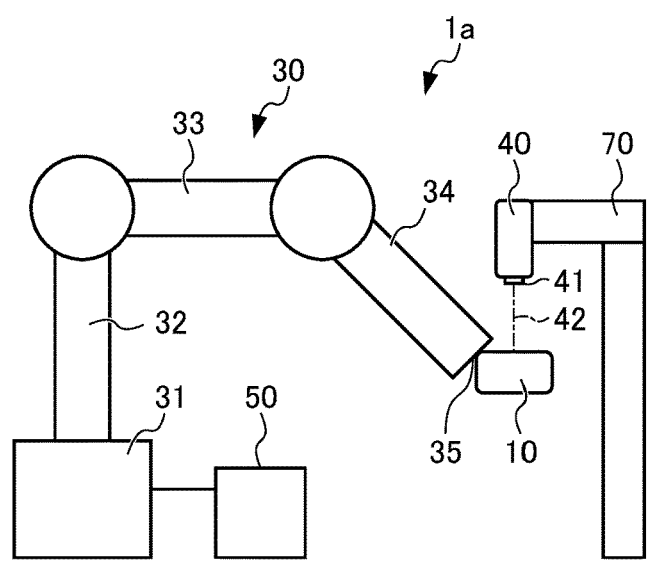
FIG. 5 is an outline block diagram showing a soldering system of semiconductor laser elements as another embodiment of the present invention.

FIG. 5 is an outline block diagram showing a soldering system of semiconductor laser elements as another embodiment of the present invention. In FIG. 5, corresponding parts with previously described FIG. 3 are indicated by attaching the same reference symbol, and individual explanations are omitted as appropriate. With the soldering system 1*a* of semiconductor laser elements in FIG. 5, the camera 40 is supported by a fixing member 70 which is independent from the movement of the robot 30. The robot 30 grips the semiconductor laser module 10 by the hand 35 of the hand mechanism 34 thereof. The control device 50 controls the robot 30 to change the spatial posture of the semiconductor laser module 10 so as to change the relative angle between the imaging optical axis 42 of the camera 40 and the semiconductor laser module 10. The control device 50 calculates the parallelism between the housing 11 of the semiconductor laser module 10 and the semiconductor laser element 12, similarly to the method explained by referencing FIG. 2, while changing the spatial posture of the semiconductor laser module 10 as mentioned above.

When changing the relative angle between the imaging optical axis 42 of the camera 40 and the semiconductor laser module 10, it is necessary to make the center of rotation be the semiconductor laser element 12. To make the center of rotation be the semiconductor laser element 12, compared to a case of the robot 30 gripping the camera 40 as previously mentioned, the hand 35 of the robot 30 and the position of the center of rotation are closer for the robot 30 gripping the semiconductor laser module 10; therefore, there is the advantage in movement being small.

Figure 6:
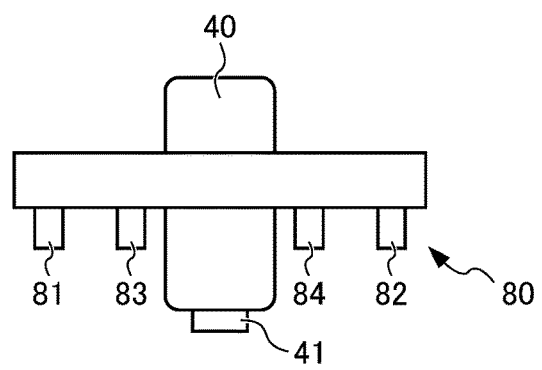
FIG. 6 is a view representing a camera and illumination means of a soldering system of semiconductor laser elements as yet another embodiment of the present invention.

FIG. 6 is a view representing a camera and illumination means of a soldering system of semiconductor laser elements as yet another embodiment of the present invention. The embodiment of FIG. 6 includes illumination 80 (81, 82, 83, 84) having a plurality of light-emitting parts capable of individually illuminating arranged at the circumference of the camera 40. For elements other than the camera 40 and illumination, it is substantially the same as the soldering systems 1, 1*a* of semiconductor laser elements in FIGS. 2 and 5 previously described. For this reason, FIGS. 2 and 5 will be adopted for explanations of these elements. In the case of FIG. 6, when each of the plurality of light-emitting parts 81, 82, 83, 84 of the illumination 80 is emitting light, the control device 50 calculates the inclination of the member 15*a* (refer to FIG. 4) relative to the housing 11 of the semiconductor laser module 10, and the inclination of the semiconductor laser element 12 relative to the housing 11, based on the change in light intensity corresponding to each of these light emissions acquired from the camera 40.

In other words, the control device 50 sets the relative position between the camera 40 and semiconductor laser module (relative position and posture in space) to a constant, causes each of the plurality of light-emitting parts 81, 82, 83, 84 of the illumination 80 to individually emit light, and separately records the light intensity (brightness of the subject) acquired from the imaging output of the camera 40 at this time. Based on these recorded values corresponding to the emitted light of the respective light-emitting parts 81, 82, 83, 84, it is possible to improve the precision of measuring inclination by calculating the inclination from the relationship between the inclination of the camera 40 and semiconductor laser module 10 and the light intensity, and averaging the calculation result for every one of the respective light-emitting parts 81, 82, 83, 84, or the like.

FIG. 7 is a flowchart of the operations of the control device and robot applied to the embodiment of the present invention, and in particular, is a flowchart for explaining the operations of the control device and robot from the viewpoint of material handling related to the soldering examination. It should be noted that, in this flowchart, the semiconductor laser module 10 is abbreviated as LD module, and the semiconductor laser element 12 is abbreviated as LD element. For this reason, in the explanation following the flowchart, the semiconductor laser module 10 is called LD module, and the semiconductor laser element 12 is called LD element.

First, under the control of the control device 50, the robot 30 conveys, to the soldering device, the LD module serving as the target of solder processing to solder the LD element or redo soldering (Step S1). When the LD module serving as the target of solder processing is conveyed to the soldering device in Step S1, predetermined soldering processing or processing for redoing soldering is executed by the soldering device by automatic operation. The working hours required for the soldering device to complete this processing are recognized by the control device 50. During these working hours, since the robot is available for other work, the control device determines presence of the LD module standing by for soldering examination (the previously mentioned examination related to positional precision and parallelism of LD element), by recognition based on records and timed operations related to the progress of the above-mentioned work, or visual perception by the camera (Step S2).

In Step S2, when the control device 50 determines that there is an LD module standing by for soldering examination (Step S2: YES), the control device 50 makes free use of the robot 30 and camera 40, and executes examination related to positional precision and parallelism of the LD element such as that explained by referencing FIGS. 2 to 6 (Step S3). On the other hand, in Step S2, when the control device 50 determines that there is not an LD module standing by for soldering examination (Step S2: NO), the control device 50 controls the robot 30 to return to the operations of Step S1.

The control device 50 determines what the results of executing examination in Step S3 are (Step S4), and when determining that the LD module is a conforming article (Step S4: YES), conveys to a location related to a subsequent step such as a location for completed product placement by way of the robot (Step S5), and ends the processing of operation control. On the other hand, the control device 50 determines what the results of executing examination in Step S3 are (Step S4), and when determining that the LD module is a defective article (Step S4: NO), conveys the LD module to which the LD element is mounted to the soldering device by way of the robot, and submits for redoing of soldering (Step S6).

The control device 50, after completion of Step S6, returns to Step S2, and determines the existence of an LD module to be the next examination subject. The soldering systems 1, 1a of semiconductor laser elements as embodiments of the present invention operate as mentioned above by referencing the flowchart of FIG. 7, when paying attention to the material handling related to soldering examination in particular.

Generally, at the moment of soldering, re-soldering heats the solder to melt, and simply performs positional adjustment of the semiconductor laser element and adjustment of parallelism again; therefore, it is often done with little workload, and the semiconductor laser element can be used as is. Only articles of good positional precision and parallelism of the semiconductor laser element advance to the subsequent step. For this reason, with the soldering systems 1, 1a of semiconductor laser elements of the embodiments of the present invention, there is a remarkable advantage in that deterioration in the coupling efficiency to optical fiber caused by the inferiority of the positional precision or parallelism of the semiconductor laser element can be prevented. In other words, according to the soldering systems 1, 1a of semiconductor laser elements of the embodiments, it is possible to determination the soldering quality of the semiconductor laser element 12 to the housing 11 of the semiconductor laser module 10 at the moment of soldering the semiconductor laser element 12.

It should be noted that the present invention is not to be limited to the previously mentioned embodiments, and can be implemented by various modifications and changes. For example, in the aforementioned embodiments of FIGS. 2 and 5, an example is explained in which the control device is provided outside of the robot; however, it is not limited to this example, and it is possible to adopt a form in which the robot includes a control device that functions as mentioned above. Additionally, modifications and improvements within a scope capable of achieving the object of the present invention are also encompassed by the present invention.

EXPLANATION OF REFERENCE NUMERALS

10 semiconductor laser module
11 housing
12 semiconductor laser element
16 fixing part
20 soldering device
30 robot
35 hand
40 camera
41 imaging lens
42 imaging optical axis
50 control device
60 component placement stand
70 fixing member
80 illumination
81, 82, 83, 84 light-emitting part

What is claimed is:

1. A soldering system of semiconductor laser elements, comprising: a soldering device that performs soldering of a semiconductor laser element in a semiconductor laser module having a housing and at least one of the semiconductor laser element; a robot that conveys the semiconductor laser module; a camera that can put the semiconductor laser module in a field of view thereof; and a control device that controls the robot and the camera with imaging output of the camera as one control factor,
   wherein the robot conveys the semiconductor laser module to an installation position of the soldering device and an imaging field of view position of the camera, and is capable of changing relative positions between the camera and a subject, under control of the control device,
   wherein the camera images the semiconductor laser module which is in the imaging field of view position thereof under control of the control device, and
   wherein the control device executes a quality determination mode that calculates a position of the semiconductor laser element based on the imaging output of the camera, as well as calculating parallelism between the housing of the semiconductor laser module and the semiconductor laser element based on a change in light intensity related to the imaging output when changing a relative position between the camera and the subject, and determines soldering quality of the semiconductor laser element based on the position and parallelism thus calculated.

2. The soldering system of semiconductor laser elements according to claim 1,
   wherein the control device controls the robot so as to convey the semiconductor laser module to the soldering device, when determining that soldering of the semiconductor laser element is inferior according to the quality determination mode, and
   wherein the soldering device solders again the semiconductor laser element thus conveyed.

3. The soldering system of semiconductor laser elements according to claim 1,
   wherein the control device compares inclination of a member between the semiconductor laser element and the housing relative to the housing, and inclination of the semiconductor laser element relative to the housing, in the quality determination mode.

4. The soldering system of semiconductor laser elements according to claim 1, further comprising illumination having a plurality of light-emitting parts capable of individually emitting light arranged at a circumference of the camera, wherein the control device calculates inclination of the member relative to the housing, and inclination of the semiconductor laser element relative to the housing, in a case of each of the plurality of light-emitting parts of the illumination emitting light, based on a change in light intensity corresponding to the respective emitted light acquired from the camera.

5. The soldering system of semiconductor laser elements according to claim 1,
   wherein the camera is supported by the robot, and
   wherein the control device controls the robot to cause the camera to change position so as to change a relative angle between an imaging optical axis of the camera and the semiconductor laser module.

6. The soldering system of semiconductor laser elements according to claim 1,
   wherein the camera is supported by a fixing member independent from movement of the robot, and
   wherein the control device controls the robot to cause the semiconductor laser module to change position so as to change a relative angle between an imaging optical axis of the camera and the semiconductor laser module.

7. The soldering system of semiconductor laser elements according to claim 1, wherein the robot is configured to include the control device.

\* \* \* \* \*